(12) United States Patent
Balasubramanian et al.

(10) Patent No.: US 9,500,705 B2
(45) Date of Patent: Nov. 22, 2016

(54) INTEGRATED CIRCUIT PROVIDING FAULT PREDICTION

(71) Applicant: Wisconsin Alumni Research Foundation, Madison, WI (US)

(72) Inventors: Raghuraman Balasubramanian, Madison, WI (US); Karthikeyan Sankaralingam, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 115 days.

(21) Appl. No.: 14/012,255

(22) Filed: Aug. 28, 2013

(65) Prior Publication Data
US 2015/0061707 A1 Mar. 5, 2015

(51) Int. Cl.
*G01R 31/317* (2006.01)

(52) U.S. Cl.
CPC .............................. *G01R 31/31725* (2013.01)

(58) Field of Classification Search
CPC ................... G01R 31/31725; G06F 11/1608; G06F 11/27; G06F 1/3206; G06F 1/324; G06F 1/3296; G06F 11/167; G06F 11/00; G06F 11/184; G06F 2217/76; G06F 11/1604
USPC ............ 324/750.01, 750.3, 750.05; 714/721, 714/738, 735, 16, 54, 726, 733, 746, 30; 713/100, 375
See application file for complete search history.

(56) References Cited

U.S. PATENT DOCUMENTS

| | | | |
|---|---|---|---|
| 5,384,906 A * | 1/1995 | Horst ............................ | 713/375 |
| 7,424,658 B1 * | 9/2008 | Ghosh Dastidar ............ | 714/738 |
| 7,797,596 B2 * | 9/2010 | Dixit et al. .................... | 714/721 |
| 8,713,490 B1 * | 4/2014 | Allen-Ware et al. ........... | 716/54 |
| 2005/0168255 A1 * | 8/2005 | Gauthier .......... | G01R 31/31727 327/161 |
| 2007/0022348 A1 * | 1/2007 | Racunas et al. .............. | 714/735 |
| 2008/0036487 A1 * | 2/2008 | Bradley et al. ............... | 324/765 |
| 2010/0188115 A1 * | 7/2010 | von Kaenel .......... | G06F 1/3203 326/16 |
| 2011/0107166 A1 * | 5/2011 | Flautner et al. .............. | 714/746 |
| 2011/0173432 A1 * | 7/2011 | Cher et al. .................... | 713/100 |
| 2011/0175658 A1 * | 7/2011 | Nomura ........................ | 327/261 |
| 2011/0209021 A1 * | 8/2011 | Sorensen et al. ............. | 714/733 |
| 2013/0002274 A1 * | 1/2013 | Saneyoshi .......... | G01R 31/2849 324/750.01 |
| 2014/0103344 A1 * | 4/2014 | Tehranipoor ....... | G01R 31/2884 257/48 |

* cited by examiner

*Primary Examiner* — Tung X Nguyen
*Assistant Examiner* — Akm Zakaria
(74) *Attorney, Agent, or Firm* — Boyle Fredrickson, S.C.

(57) ABSTRACT

The prediction of hardware failure is obtained by operating two redundant circuit modules while one circuit module is artificially aged. The output of the two circuit modules is compared and a discrepancy between outputs indicates a projected failure of the aged modules. Aging may be accomplished by one or a combination of lowering operating voltages and re-phasing a sampling clock to reduce slack time both of which provide increased sensitivity to gate delay.

20 Claims, 4 Drawing Sheets

INTEGRATED CIRCUIT PROVIDING FAULT PREDICTION

STATEMENT REGARDING FEDERALLY SPONSORED RESEARCH OR DEVELOPMENT

This invention was made with government support under 1117782 awarded by the National Science Foundation. The government has certain rights in the invention.

CROSS REFERENCE TO RELATED APPLICATION

- - -

BACKGROUND OF THE INVENTION

The present invention relates to integrated circuits having circuit elements subject to increased transmission delay with age and in particular to a method and apparatus for anticipating age-related failure of the gates of an integrated circuit.

Logical gates are building block circuit elements of digital integrated circuits that implement a Boolean function using multiple transistors to receive an input at one or more inputs, interpret the inputs as logic levels, and provide an output voltage being the Boolean function of the inputs. Logical gates generally form building components of more complex devices including counters, storage registers, and the like.

Future generations of integrated circuits such as microprocessors are increasingly likely to fail in the field because of device faults at logical gates. The failure may be a "soft failure" where the logical gate operates, but at a reduced level of performance that prevents it from coordinating with other components of the integrated circuit (for example, an increased gate delay which prevents successful propagation of high-speed signals) or "hard failure" where the logical gate ceases to perform any useful function.

A number of age-related wearout mechanisms for logical gates have been identified. Bias temperature instability (BTI) may occur when a negative bias is applied to a gate at elevated temperature causing holes/electron pairs to migrate to the silicon-oxide interface. This increases the threshold voltage of the gate increasing a gate delay. A 10 percent to 15 percent degradation in threshold voltage can cause a delay degradation of 15 percent over three years of continuous operation.

Hot carrier injection (HCl) occurs occasionally when carriers (elections or holes) gain sufficient kinetic energy to break into the gate dielectric. Over time this accumulation of carriers in the dielectric causes degradation (increase) in the threshold voltage.

Time-dependent dielectric breakdown (TDDB) can occur when longtime application of the low electrical fields causes gate oxide degradation. Eventually this degradation may lead to the formation of a conductive path from the gate to the substrate irreversibly damaging the gate.

The failure of an integrated circuit caused by logical gate failure may be detected by comparing the operation of redundant integrated circuit modules under the assumption that both will not fail simultaneously in the same way. This approach incurs significant power overhead and design complexity from the need to create and simultaneously operate redundant components.

The power overhead of operating two redundant components in parallel can be reduced by a sampling approach in which the comparison process is implemented only after specified or random intervals of time. This sampling approach, however, can miss faults that result in errors that occur infrequently.

The problem of failing to detect infrequent faults can be minimized through fault prediction that allows a response before actual faults occur. Two principal techniques of fault prediction are "canary-based" and "in-situ" faults which both attempt to predict faults by detecting the early signs of aging in increasing gate delays.

Canary-based fault prediction provides a special test circuit using gates that are in the same environment and have the same device technology as gates in the broader integrated circuit but which can be more easily monitored for increased gate delay. Canary-based fault prediction suffers from the difficulty of exactly matching the "canary circuit" to the target circuit, termed the "accuracy" problem.

"In-situ" fault prediction monitors actual gates of the target circuit eliminating the accuracy problem. Nevertheless, in situ fault prediction is practically limited to a small subset of those gates and thus suffers from poor generality, missing possibly significant increases in gate delays in gates that are not monitored.

SUMMARY OF THE INVENTION

The present invention provides a prediction technique with both good accuracy and generality possible by providing a comparison between the entireties of two similar circuit modules where one is momentarily artificially aged. This aging process, for example, may be performed by lowering the operating voltage of one of the circuit modules to aggravate gate delay. Alternatively, the "slack time" can be decreased, that is, the time in excess of the guard band time normally allotted for state transition, to increase sensitivity to aging induced gate delay. In both cases, the invention uses gate delay as proxy for circuit wear reflecting the underlying linkage between these two measures. By using actual elements of the target circuit and by being able to predict further into the future through artificial aging the likelihood of detecting n infrequent errors caused by faults can be increased, resulting in high accuracy and, by rotating the aged circuit module through all circuit modules, good detection coverage may be obtained.

Specifically, the present invention provides an integrated circuit with at least a first and second redundant circuit module comprised of multiple gates subject to increased gate delay with age. A reliability circuitry operates to momentarily and selectively stress the first redundant circuit module in a manner mimicking age-increased gate delay without stressing the second redundant circuit module and to capture outputs from first and second redundant circuit modules during the stressing. The captured outputs are then compared to detect errors caused by the selected stressing.

It is thus a feature of at least one embodiment of the invention to provide a method of predicting gate failure that may comprehensively examine the actual gates for which the prediction is desired. The agency of artificially aging the circuit allows the circuit modules themselves to be used as a basis for prediction.

The captured first and second values may be latched outputs of logical gates or program values derived from the first and second outputs.

It is thus a feature of at least one embodiment of the invention to provide a variety of different methods of comparing an aged and un-aged module to detect faults.

The process of selectively aging the circuit module and making the comparison may be repeated.

It is a further feature of at least one embodiment of the invention to obtain the benefits of a sampling system in reduced power consumption and resource overhead with reduced risk of missing infrequent errors associated with failures. The invention may artificially age the circuit modules to a point sufficiently far into the future where imminent intermittent faults will have become substantially continuous to be readily detected with occasional sampling.

The aging and comparison process may be completed during an interval less than 1/10 of a time between periodic repetitions of the aging and comparison process.

It is thus a feature of at least one embodiment of the invention to provide a failure prediction system providing low power and resource overhead.

At different periodic repetitions, the second redundant circuit module may be stressed without a stressing of the first redundant circuit module.

It is thus a feature of at least one embodiment of the invention to rotate among the circuit modules being tested to provide good generality.

The stress may be induced by lowering an operating voltage of the gates of the first redundant circuit module relative to an operating voltage of the gates of the second redundant circuit module.

It is thus a feature of at least one embodiment of the invention to provide a simple method of mimicking the aging of integrated circuits that can be applied easily to large numbers of gates without significant added complexity.

Alternatively or in addition, the stress may be induced by decreasing a slack time in a capture of the outputs from the first redundant circuit module relative to a capture of the outputs of the second redundant circuit module.

It is thus a feature of at least one embodiment of the invention to provide a method of testing "fast path" chains of logical gate circuits in which sufficient delay time cannot be promoted simply by lowered operating voltage.

The slack time may be decreased by changing a phase of a clock controlling capture of the outputs relative to a phase of a clock controlling inputs to the gates.

It is thus a feature of at least one embodiment of the invention to provide a simple method of changing the slack time of the fast path chains of logical circuits by clock phasing.

The stress may be induced for a first portion of the first redundant circuit module by decreasing a slack time and the stress may be induced for a second portion of the first redundant circuit module by decreasing an operating voltage of the gates.

It is thus a feature of at least one embodiment of the invention to provide great generality in the prediction by applying different aging techniques to fast path and critical path circuits to which these different techniques are best adapted.

The first and second redundant circuit modules may be circuits synchronously driven by a clock signal and wherein the capturing is performed by latches synchronized in frequency to the clock signal.

It is thus a feature of at least one embodiment of the invention to provide a simple method of comparing two circuit modules.

The integrated stress may mimic an aging of at least one month.

It is thus a feature of at least one embodiment of the invention to encourage prediction in advance of the occurrence of even intermittent failures.

The first and second redundant circuits may be substantially identical.

The first and second redundant circuits may be processor cores and the reliability circuitry may be a processor core.

It is thus a feature of at least one embodiment of the invention to provide a method of predicting gate failure that may be implemented largely with existing hardware.

Upon a prediction of failure, the operation of the integrated circuit may be modified.

It is thus a feature of at least one embodiment of the invention to use the prediction information to mitigate the effects of any imminent failure.

The modification of the operation of the integrated circuit, for example, may slow the clock speed of the integrated circuit or block operation of predetermined critical functions from being performed on the component predicted to fail, or may output a signal to a user of the integrated circuit indicating an error.

It is thus a feature of at least one embodiment of the invention to accommodate a variety of failure mitigation techniques making trade-offs between reliability and availability.

These particular objects and advantages may apply to only some embodiments falling within the claims and thus do not define the scope of the invention.

DETAILED DESCRIPTION OF THE PREFERRED EMBODIMENT

Figure 1:
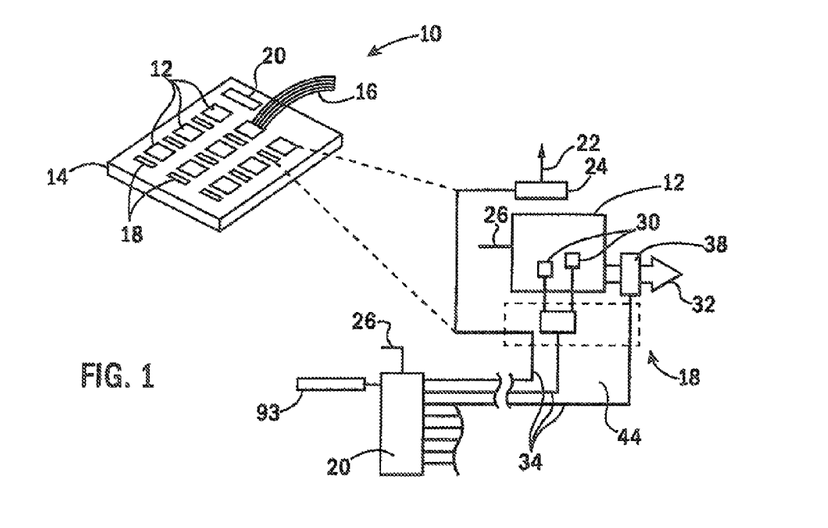
FIG. 1 is a simplified perspective view of a multicore processor, being an example circuit that may be used with the present invention, showing a fragmentary block diagram of one core together with reliability circuitry components associated with that core and reliability circuitry components communicating with all of the cores and used to predict errors in the cores.

Referring now to FIG. 1, an integrated circuit 10 operating according to the present invention, for example, may provide for a microprocessor system having multiple processing cores 12 fabricated on a common substrate 14. As is understood in the art, each of the cores 12 will be composed of multiple gates 16 including, for example. Boolean logic gates such as AND or OR-gates which may be assembled into other well-known structures including latches, counters, and arithmetic elements such as adders, shifters and the like as is generally understood in the art. These structures may together form computer structures such as an arithmetic logic unit (ALU), registers and the like. Each of these gates 16 may be constructed using complementary metal-oxide-semiconductor (CMOS) architectures; however, the present invention is not limited to this architecture.

Each of the cores 12 may be associated with local reliability circuitry 18 associated with each core which coordinates failure prediction operations with respect to each core 12 and a global reliability circuitry 20 coordinating the local reliability circuitry 18 among multiple cores 12. The local reliability circuitry 18 may control an operating voltage 22 supplied to the cores 12 through a controllable regulator 24 to vary the voltage received by the cores 12 between a normal operating voltage ($V_{dd}$) and a lower operating voltage simulating aging as will be discussed. The regulator 24 may consist of a set of parallel transistor elements providing a variable voltage drop depending on the number of transistors activated.

The local reliability circuitry 18 further receives a standard clock signal 26 and provides clock signals 26 to selected fast gate paths 30 in the core 12, as will be discussed, also to provide for simulated aging.

In addition, the local reliability circuitry 18 may capture an output 32 of the associated cores 12 at a predetermined coordinated time or at comparable architectural states.

The local reliability circuitry 18 may communicate with the global reliability circuitry 20 through a lightweight communication network 34 allowing the global reliability circuitry 20 to activate the local reliability circuitry 18 to selectively age the core 12 and to capture the output 32 and transmit that output to the global reliability circuitry 20 to compare with outputs of other cores 12 in a detection process.

Figure 2:
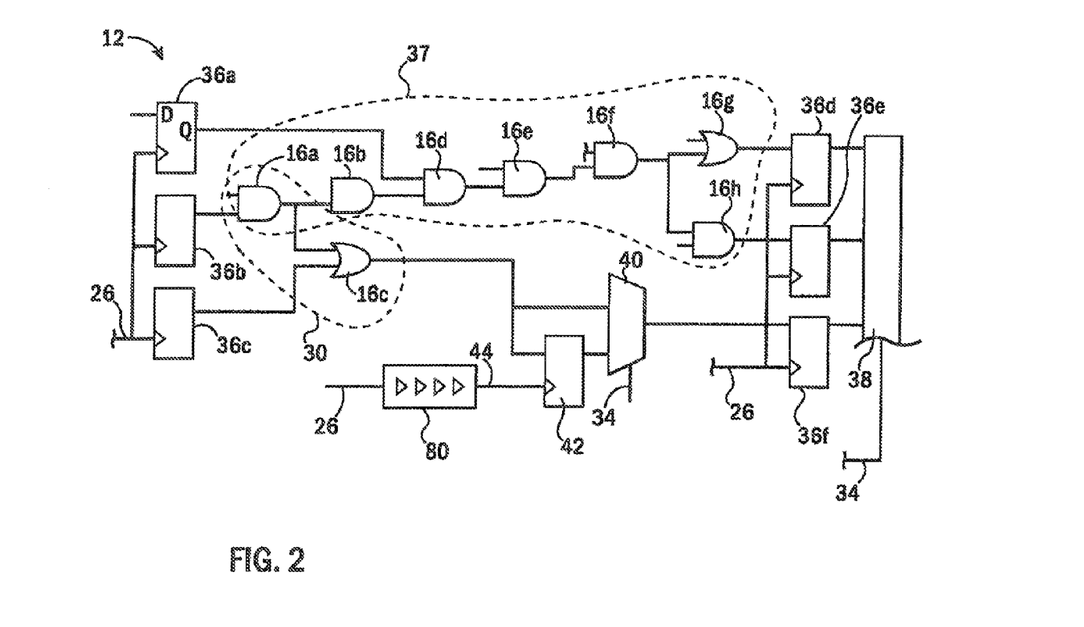
FIG. 2 is a simplified fragmentary view of a gate in one of the cores showing added reliability circuitry components used for artificial aging by clock phasing.

Referring now to FIG. 2, an example portion of the core 12 may comprise multiple interconnected logical gates 16a-16h receiving inputs from latches 36a-36c (also composed of gates) clocked by a first clock signal 26. It will be understood that the clocking of the latches 36a-36c means that the outputs from the latches 36a-36e and hence the inputs of gates 16a-16h are synchronized to the first clock signal 26. These latches 36 may be, for example, D-type flip-flops of the type well known in the art.

Outputs from some of the logical gates 16a, 16b, and 16d-16h ultimately provide inputs to latches 36d and 36c based on a chain of transmission of signals through as many as six gates 16. Generally, the signal path from latches 36b through gates 16a, 16b, 16d, 16e, 16f, and 16g to latch 36e represents a critical path 37 in that the accumulated gate delays with aging of the gates could cause a failure for a signal to propagate through these gates in time to be captured by the output latches 36.

In contrast, outputs from logical gates 16a and 16c ultimately provide input to the latch 36f through as few as two gates. This signal path from latches 36b, 36c through the gates 16a and 16c to latch 36f represents a fast path 30 where accumulated gate delays with aging are unlikely to prevent signal propagation on a timely basis.

In the present invention, the outputs of the fast paths 30 during simulated aging are captured by a trace latch 42 before being selectively provided to latch 36f through multiplexer 40. As will be discussed below, fast sample latch 42 is not driven by clock signal 26 directly but rather a phase delayed clock signal 44 derived from clock signal 26. The operation of these components will be described in detail below.

Figure 5:
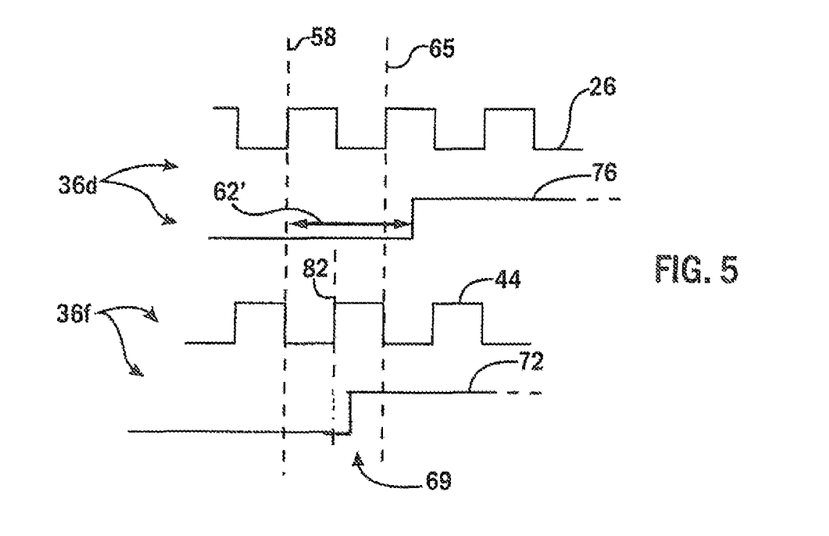
FIG. 5 is a figure similar to that of FIG. 4 showing the use of clock phasing to provide simulated aging for "fast gate" paths.

Referring to FIGS. 2 and 5, the failure process of the critical path 37 and fast path 30 can be seen to differ significantly. Signals may be introduced into the critical path 37 on a rising edge 58 of clock signal 26 to input latches 36a and 36b and will be manifest, for example, at latch 36d as rising edge 60 on un-aged timing signal 64. The rising edge 60 will occur at a delay interval 62 after rising edge 58. This delay interval 62 is the sum of the gate delays of each of the gates of the critical path 37. The rising edge 60 must arrive at gate 36d before a sampling edge 65 of the clock signal 26 to be properly latched by latch 36d. The time between the rising edge 58 of clock signal 26 and the sampling edge define a guard band 61 intended to ensure proper capture of the signal by the latch 36d. The time between the rising edge of signal 64 and sampling edge 65 define a slack time 68 being an amount of additional delay that the circuit may accumulate and still function properly.

As the components age, aged timing signal 66 representing actual aging of the components will exhibit a much longer delay interval 62' than delay interval 62. This longer delay interval 62' results from a total of the increase in the delays of each gate 16 in the critical path 37 and can cause a rising edge 60' of the aged timing signal 66 to occur after sampling edge 65 eliminating all slack time 68 with the result that the latch 36d fails to capture the output state of the critical path 37. This would cause a fault in the associated circuit.

In contrast, for the fast path 30, signals may be introduced on a rising edge 58 of clock signal 26 and arrive, for example, at latch L3 (36f) at rising edge 69 of an aged timing signal 70 and after a much shorter delay interval 62" following rising edge 58, this shorter delay interval 62" will be the sum of fewer gate delays. As a result the slack time 68 is much larger for the fast path 30 and even after aging (as indicated by aged timing signal 72 exhibiting an increased delay interval 62'"), the slack time 68 is not exhausted and the aged timing signal 72 is properly captured by the latch 36f. This lack of significant exhaustion of the slack time 68 does not mean that the components of the fast path 30 are not susceptible to failure. Rather the failure will not be manifest as a gate delay but will result ultimately in a complete failure of the gate as indicated by signal 74, for example, where the gate remains in a single state and is unresponsive to its input signals.

This difference in the manifestation of errors by the critical path 37 and fast path 30 requires different methods to artificially age these components in the process of the present invention as will be discussed in detail below so that failures during aging can be detected.

Figure 3:
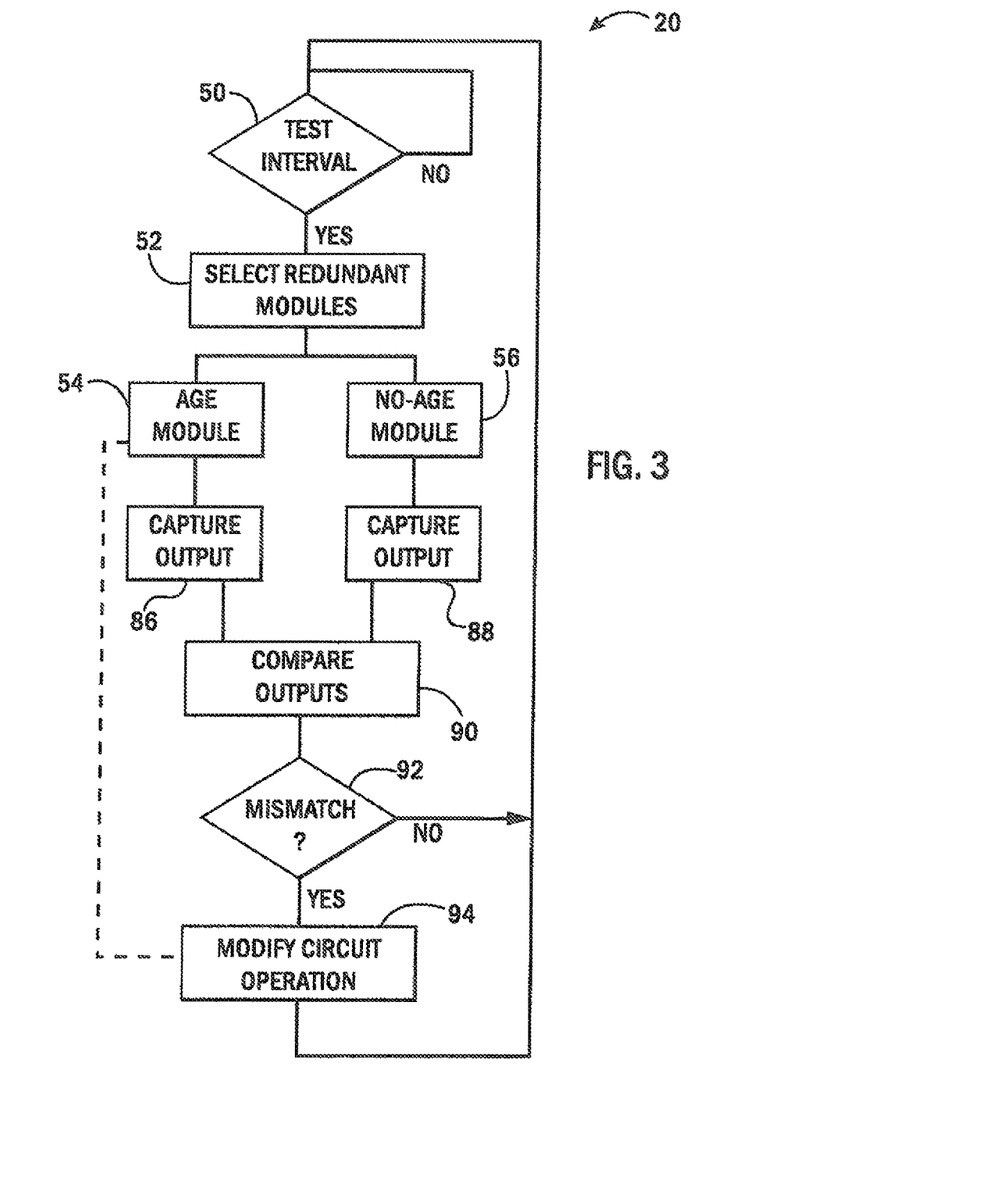
FIG. 3 is a flowchart of the operations implemented by the reliability circuitry of FIG. 1.

Referring now to FIG. 3, the global reliability circuitry 20 operates alone or in conjunction with an operating system to establish a test interval at which the integrated circuit 10 will be tested by artificial aging. This interval is detected at decision block 50 to begin the aging process. During the test interval, two or more redundant circuit modules, for example two different cores 12, will be tested by artificially aging at least one of the circuit modules and then comparing outputs 32 of the aged circuit modules to an un-aged circuit module to see if there is any difference in the outputs. Any difference in the outputs of these two circuit modules suggests a failure in the aged circuit module and accordingly fault is predicted in that aged circuit module. The time taken for the test (the test interval) will typically be a small proportion of the time during which testing is not performed fix example, one 10th of the latter or less. In this way the overhead of the prediction process is reduced and controllable.

If at decision block 50 the test interval has arrived, the program proceeds to process block 52 and a selection is made of which redundant circuit modules will be tested (aged) and which will serve as a baseline. In one implementation, this selection process is a round-robin process in which different cores successively assume the roles of the aged and un-aged circuit modules. In the simplest case, two redundant circuit modules are selected and one is aged and one is not aged; however it will be appreciated that multiple modules may be tested at the same time.

Upon selection of the target circuit modules, the global reliability circuitry 20 then applies aging to one selected redundant module as indicated by process block 54 and operates a second redundant circuit module as indicated by process block 56 without aging. The second redundant circuit module, when not used to check the output of the first redundant module as described below, may be used for running other programs (normal operation).

Referring to FIGS. 1 and 2 the aging process may use either or both of two mechanisms: aging by lowering the operating voltage (typically used for critical paths 37) through the regulator 24 and aging by clock phasing (typically used for fast path 30) using phase clock signals 26.

The ability to artificially age circuits by lowering the operating voltage relies on the observation that gate delay ($t_d$) from aging effects change the threshold voltage of the gate and can be simulated by a drop in operating voltage according to the equation:

$$t_d = \frac{2LC}{W\mu_{eff}C_{ox}(V_{dd} - V_{th})^2} \quad (1)$$

where C is the capacitance of the gate, L and W are the size of the gate, $C_{ox}$ is the gate oxide capacitance, $\mu_{eff}$ is the charge carrier mobility, $V_{dd}$ is the operating voltage, and $V_{th}$ is the threshold voltage (defining the minimum difference between input voltages needed to switch logical states of the gate) which increases as age increases.

Figure 4:
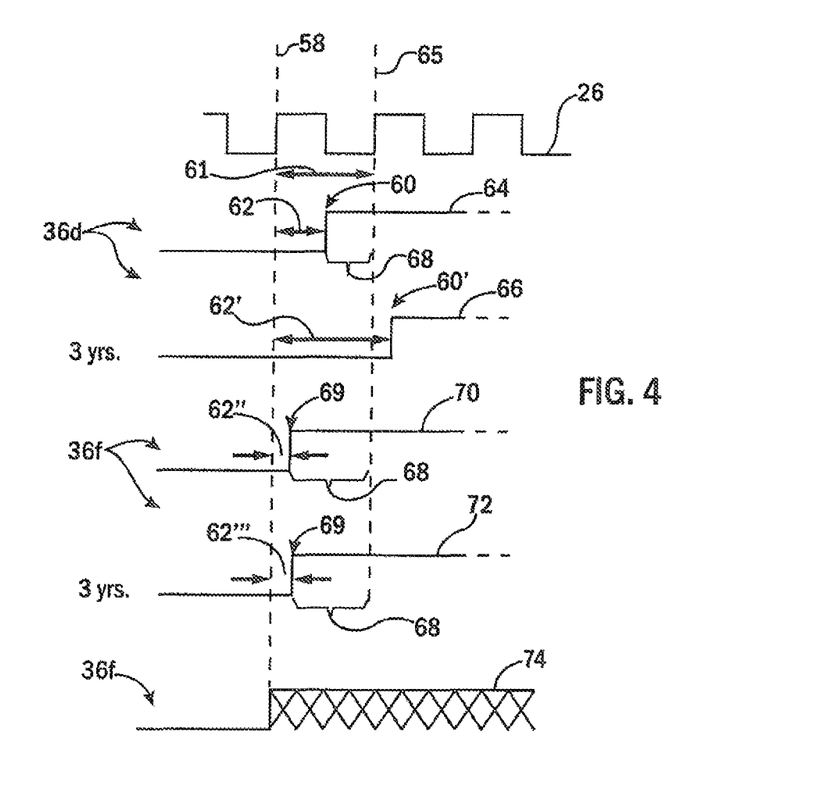
FIG. 4 is a set of aligned timing diagrams showing simulated aging by operating voltage reduction for "critical paths" sensitive to this technique and "fast gate" paths that are not sensitive to this technique.

Referring to FIGS. 3 and 5, the gates in the critical path 37 may thus be artificially aged by lowering the operating voltage resulting in an artificially aged timing signal 76 providing a delay interval 62″ similar to that shown in the actual aged timing signal 66 of FIG. 4. Typically, the operating voltage will be adjusted to provide anywhere from 3 to 9 months of effective simulated aging.

It will be appreciated that as the integrated circuit 10 actually ages, the operating voltage reduction will automatically add an additional aging increment and so a constant operating voltage reduction may be used to provide a prediction of the fixed period of time (for example three months) into the future. Alternatively actual aging of the integrated circuit may be determined (for example by a clock circuit or canary-type circuit) which may be used to adjust the change in operating voltage according to a schedule either to better approximate constant interval of forward prediction or to change the sensitivity (for example predicting further into the future) as the circuit ages.

It will be appreciated that this operating voltage adjustment will be unsuccessful with the fast path 30 shown in FIG. 4 by aged timing signal 72 insofar as the slack time 68 is extremely large (as is necessary to accommodate synchronous critical paths 37).

Figure 6:
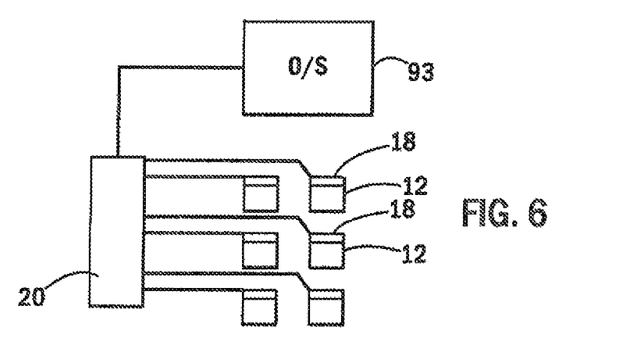
FIG. 6 is a block diagram of a multicore processor and reliability circuitry communicating with an operating system to respond to predicted failure of given cores.

Accordingly, artificially aging of the fast path 30 is performed by clock phasing which effectively accelerates the sampling of the outputs of the fast path gates to effectively reduce the slack time. Referring to FIGS. 2 and 6, for the fast path 30, the local reliability circuitry 18 under the control of the global reliability circuitry 20 provides a phase delayed clock signal 44, for example, derived from timing signal 66 by a delay circuit 80, for example, being a set of gates imposing a phase delay. Although phase delayed clock signal 44 is delayed with respect to clock signal 26, because of the periodicity of both it also appears as a phase advanced clock signal as will be appreciated.

As before, signals may be introduced into the fast path 30 on a rising edge 58 of clock signal 26 but now they are effectively sampled at rising edge 82 of phase delayed clock signal 44 arriving earlier than sampling edge 65 of clock signal 26, This may be done, for example, by substituting phase delayed clock signal 44 for clock signal 26 at latch 36*f* or as depicted by installing an additional fast sample latch 42 clock by phase delayed clock signal 44 to essentially sample the output of gate 16*c* at rising edge 82 and then providing that output to latch 36. This phase delayed clock signal 44 is only introduced into the fast path 30 upon a signal from the global reliability circuitry 20 operating on multiplexer 40 which provides either the output of the fast sample latch 42 or the output of gate 16*c* to latch 36*f*.

As depicted in FIG. 5, the aged timing signal 72 (described with respect to FIG. 4) when sampled with the phase delayed clock signal 44 exhibits an output error because rising edge 69 arrives after sampling edge 65 and thus cannot be captured by the fast sample latch 42. The net effect is practically to reduce the slack time so as to be sensitive to increases in aging delay of these gates of the fast path 30.

It should be noted that this technique of phased clocking may be used in tandem with the lowering of the operating voltage so as to eliminate the need to segregate operating voltages of different gates associated with the critical paths 37 and fast path 30 and to accentuate the sensitivity of this technique for the fast paths 30.

Referring again to FIG. 3, after the artificial aging introduced by lowering the operating voltage and/or phasing of the clock 26, the outputs of the aged modules and un-aged modules are captured as indicated by process box 86 and 88 as captured values, for example, by a trace latch 38 on the output of each core 12. At process block 90, these captured values are compared typically by forwarding them back over lightweight network 34 to the global reliability circuitry 20. Any discrepancy in the captured values of these differentially aged modules as detected at decision block 92 triggers a modification of circuit operation as indicated by process block 94.

While the present invention contemplates comparing values captured at the gate level it will be appreciated that the comparison may be made using values derived at subsequent steps of processing the gate output values, for example, by software such as the operating system using the output values as part of a calculation. In this case, two software different processed program values based each on a different output from an aged module and un-aged module may be compared to detect an error from a fault in the aged module at process block 90. Program values means values produced by operation of a computer program having arguments including or derived from the gate output values. As before, this comparison process eliminates the need to have before-the-fact knowledge of the proper output values from the aged module. The comparison may operate on a full set of outputs or any representative subset or compression of outputs including hashes, checksums or signatures derived from the outputs operative to reveal in the comparison operation a desired level of fault. All of these comparisons should be considered comparisons of the captured values because the involve comparisons that detect differences in the captured values Although this mismatch detected at decision block 92 may be between as few as two different redundant circuit modules, it will also be appreciated that comparisons among multiple aged and un-aged circuit modules may be performed either to accelerate the testing process or to increase its reliability, for example, by looking at multiple usage circuit modules as a baseline.

The modification of the circuit operation of process block 94 may be as simple as setting a register that may be read by the operating system and/or presented to the user to indicate a failure prediction and to designate a particular core 12 or other module predicted to fail. Further automatic steps may be taken upon predicted failure, for example decreasing clock rate for modules that are predicted to fail.

Referring now to FIG. 6, in one embodiment, at process block 94, when the global reliability circuitry 20 signals the operating system 93 of an imminent hardware failure, the operating system may respond by allocating computational tasks among the cores 12, for example, to put noncritical tasks on those cores 12 predicted to fail. For example, the operating system kernel operations may be allocated to cores 12 that are reliable and background tasks may be allocated to cores subject to projected failure. The user may designate certain processes as requiring reliable execution in this designation that may be respected by the operating system.

Figure 7:
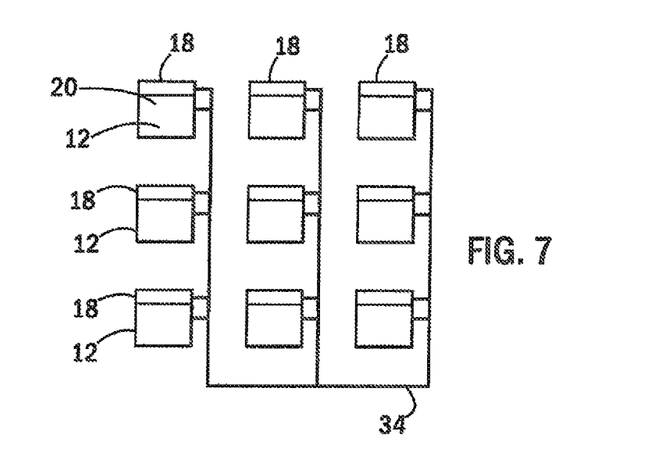
FIG. 7 is a block diagram of a multicore processor in which individual cores may be enlisted, to operate as common components of the reliability circuitry.

Referring now to FIG. 7 although the global reliability circuitry 20 has been depicted as a separate circuit element, it will be appreciated that one or more of the cores 12 may be designated to implement the global reliability circuitry 20 and this responsibility may be rotated among the cores 12 so that the only specialty hardware required is that of local reliability circuitry 18. In such a system, cores that have been predicted failures are excluded from supporting the global reliability circuitry 20 in future round robin exchanges. Parts or all of the global reliability circuit 20 may be implemented by the operating system.

The present invention is not limited to use with microprocessor cores and can be used in any integrated circuit architecture having multiple redundant circuit modules. It will be appreciated that the redundant circuit modules used for predicting failure need not be identical if they have functionally comparable outputs. Although the present invention anticipates full coverage of the circuit modules of the integrated circuit, it will be appreciated that it can be applied to only portions of an integrated circuit, for example, providing critical function of the integrated circuit.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

References to "a microprocessor" and "a processor" or "the microprocessor" and "the processor," can be understood to include one or more microprocessors that can communicate in a stand-alone and/or a distributed environment(s), and can thus be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network.

It is specifically intended that the present invention not be limited to the embodiments and illustrations contained herein and the claims should be understood to include modified forms of those embodiments including portions of the embodiments and combinations of elements of different embodiments as conic within the scope of the following claims. All of the publications described herein, including patents and non-patent publications are hereby incorporated herein by reference in their entireties.

What we claim is:

1. An integrated circuit comprised of multiple gates subject to increased gate delay with age, the integrated circuit comprising:
   at least a first and second redundant circuit module concurrently generating first and second respective outputs; and
   a reliability circuitry operating to:
   (a) momentarily and selectively apply a stress to the first redundant circuit module in a manner mimicking age-increased gate delay which changes the first output of the first redundant circuit module compared to the second output of the second redundant circuit module without applying the stress to the second redundant circuit module, the stress including at least one of: (i) decreasing an operating voltage of gates of the first redundant circuit module relative to an operating voltage of gates of the second redundant circuit module, and (ii) decreasing a slack time in a capture of a signal of the first redundant circuit module relative to a capture of a corresponding signal of the second redundant circuit module;
   (b) capture first and second values based on the respective first changed output and second output from the first and second redundant circuit modules during the stressing; and
   (c) compare the captured first and second values to detect errors caused by the selective stressing.

2. The integrated circuit of claim 1 wherein the captured first and second values are latched outputs of logical gates.

3. The integrated circuit of claim 1 wherein steps (a)-(c) are repeated.

4. The integrated circuit of claim 3 wherein steps (a)-(c) are completed during an interval and wherein a duration of the interval is less than 1/10 of a time between periodic repetitions of steps (a)-(c).

5. The integrated circuit of claim 3 wherein at different periodic repetitions, steps (a)-(c) are varied to stress the second redundant circuit module without a stressing of the first redundant circuit module.

6. The integrated circuit of claim 1 wherein the stress is induced by lowering an operating voltage of the gates of the first redundant circuit module relative to an operating voltage of the gates of the second redundant circuit module.

7. The integrated circuit of claim 1 wherein the stress is induced by decreasing a slack time in a capture of at least some of the outputs from the first redundant circuit module relative to a capture of the outputs of the second redundant circuit module.

8. The integrated circuit of claim 7 wherein the slack time is decreased by changing a phase of a clock controlling capture of the at least some of the outputs relative to a phase of a clock controlling inputs to the gates.

9. The integrated circuit of claim 7 wherein the stress is induced for a first portion of the first redundant circuit module by decreasing a slack time in a capture of at least some of the output from the first portion of the first redundant circuit module relative to a capture of corresponding outputs from a corresponding first portion of the second redundant circuit module; and
wherein the stress is induced for a second portion of the first redundant circuit module by decreasing an operating voltage of gates of the second portion of the first redundant circuit module relative to an operating voltage of gates of a corresponding second portion of the second redundant circuit module.

10. The integrated circuit of claim 1 wherein the first and second redundant circuit modules are circuits synchronously driven by a clock signal and wherein the capturing is performed by latches synchronized in frequency to the clock signal.

11. The integrated circuit of claim 1 wherein the stress mimics an aging of at least one month.

12. The integrated circuit of claim 1 wherein the first and second redundant circuits are substantially identical.

13. The integrated circuit of claim 1 wherein the first and second redundant circuits are processor cores.

14. The integrated circuit of claim 13 wherein the reliability circuitry is a processor core.

15. The integrated circuit of claim 1 further including the step of (d) modifying operation of the integrated circuit in response to a detected error at step (c).

16. The integrated circuit of claim 15 wherein the modification of the operation of the integrated circuit slows a clock speed of the integrated circuit.

17. The integrated circuit of claim 15 wherein the modification of the operation of the integrated circuit blocks operation of predetermined critical functions from being performed on the first redundant circuit module in response to an error detected at step (c).

18. The integrated circuit of claim 1 further including the step of (d) outputting a signal to a user of the integrated circuit indicating an error detected at step (c).

19. A method of predicting failure in an integrated circuit comprised of multiple gates subject to increased gate delay with age in the integrated circuit, the method comprising the steps of:
(a) momentarily and selectively stressing a first redundant circuit module of the integrated circuit in a manner mimicking age-increased gate delay which changes the output of the first redundant circuit module compared to an output of the second redundant circuit module without stressing a concurrently operating second redundant circuit module of the integrated circuit, the stressing including at least one of: (i) decreasing an operating voltage of gates of the first redundant circuit module relative to an operating voltage of gates of the second redundant circuit module, and (ii) decreasing a slack time in a capture of a signal of the first redundant circuit module relative to a capture of a corresponding of the second redundant circuit module;
(b) capturing the first changed output and second output from first and second redundant circuit modules during the stressing; and
(c) comparing the captured outputs to detect errors caused by the selective stressing.

20. The integrated circuit of claim 1 wherein the captured first and second values are program values derived from the first and second outputs.

* * * * *